(12) United States Patent
Wang

(10) Patent No.: US 6,293,331 B1
(45) Date of Patent: Sep. 25, 2001

(54) VIBRATION AND SHOCK RESISTANT HEAT SINK ASSEMBLY

(75) Inventor: Chong-Sheng Wang, Mansfield, MA (US)

(73) Assignee: Tyco Electronics Logistics AG, Steinach (CH)

( * ) Notice: Subject to any disclaimer, the term of this patent is extended or adjusted under 35 U.S.C. 154(b) by 0 days.

(21) Appl. No.: 09/637,418

(22) Filed: Aug. 11, 2000

(51) Int. Cl.$^7$ ...................................................... H05K 7/20
(52) U.S. Cl. ........................ 165/80.3; 165/185; 174/16.3; 257/718; 257/722; 361/704
(58) Field of Search .................................. 165/80.3, 185; 174/16.3; 257/718, 719, 722; 361/704

(56) References Cited

U.S. PATENT DOCUMENTS

| | | |
|---|---|---|
| Re. 35,573 | 7/1997 | Clemens . |
| 2,432,513 | 12/1947 | Depew . |
| 2,916,159 | 12/1959 | O'Neill . |
| 2,958,515 | 11/1960 | Booher . |
| 3,033,537 | 5/1962 | Brown, Jr. . |
| 3,146,384 | 8/1964 | Ruehle . |
| 3,182,114 | 5/1965 | Burgess et al. . |
| 3,229,756 | 1/1966 | Keresztury . |
| 3,417,300 | 12/1968 | Kauffman . |
| 4,345,267 | 8/1982 | Corman et al. . |
| 4,396,935 | 8/1983 | Schuck . |
| 4,481,525 | 11/1984 | Calabro et al. . |
| 4,576,224 | 3/1986 | Eaton et al. . |
| 4,593,342 | 6/1986 | Lindsay . |
| 4,607,685 | 8/1986 | Mitchell, Jr. ........................ 165/80.3 |
| 4,660,123 | 4/1987 | Hermann . |
| 4,745,456 | 5/1988 | Clemens . |
| 4,753,287 | 6/1988 | Horne . |
| 4,924,352 | 5/1990 | Septfons . |
| 5,053,853 | 10/1991 | Haj-Ali-Ahmadj et al. . |
| 5,170,323 | 12/1992 | Perretta et al. . |
| 5,313,099 | 5/1994 | Tata et al. ........................ 257/718 X |
| 5,353,193 | * 10/1994 | Chia et al. ............................ 361/704 |
| 5,397,919 | 3/1995 | Tata et al. ........................ 257/718 X |
| 5,566,052 | * 10/1996 | Hughes ................................ 361/704 |
| 5,667,870 | * 9/1997 | McCullough .................... 257/718 X |
| 5,708,564 | 1/1998 | Lin ....................................... 361/704 |

FOREIGN PATENT DOCUMENTS

| | | |
|---|---|---|
| 295 16 627 U1 | 2/1996 | (DE) . |
| 0 130 279 A3 | 3/1984 | (EP) . |
| 58-176959 | 10/1983 | (JP) . |

* cited by examiner

*Primary Examiner*—Leonard Leo
(74) *Attorney, Agent, or Firm*—Barlow, Josephs & Holmes

(57) ABSTRACT

A vibration and shock resistant heat dissipating device for removing heat from a heat generating object is disclosed. The heat dissipating device includes a retaining clip having a central member and a pair of legs depending downwardly therefrom. An aperture is disposed through the central member and defines a central member bore having female threading formed therein. The free ends of the pair of legs are secured relative to the heat generating object. A heat dissipating member having a threaded base portion with a substantially flat bottom surface is adapted to be threadably received in the center member bore so that the flat bottom surface of the heat dissipating member is in flush thermal communication with the heat generating member. A ratchet member is disposed between the retaining clip and the heat dissipating member for controlling threaded receipt of the threaded base portion in the retaining clip. The ratchet member permits only inward installation threading of the base portion into the center member bore while preventing threaded removal of the base portion out from retaining clip. Use of a tool enables threaded removal of the base portion out from the retaining clip.

22 Claims, 4 Drawing Sheets

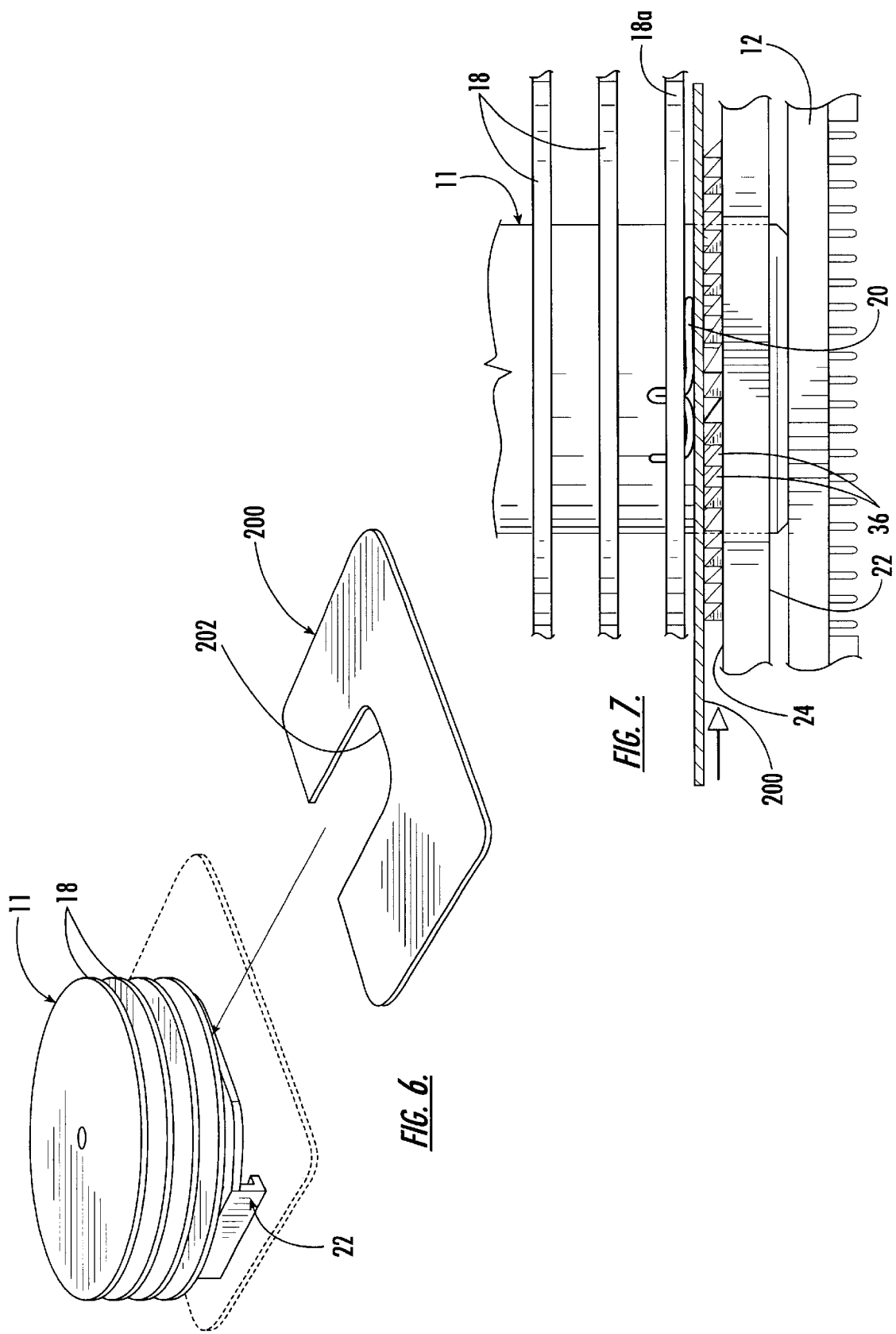

VIBRATION AND SHOCK RESISTANT HEAT SINK ASSEMBLY

BACKGROUND OF THE INVENTION

The present invention relates generally cooling heat generating objects, such as electronic solid state and integrated circuit devices. More specifically, the present invention relates to apparatuses for dissipating heat generated by such devices.

In the electronics and computer industries, it has been well known to employ various types of electronic device packages and integrated circuit chips, such as the PENTIUM central processing unit chip (CPU) manufactured by Intel Corporation and RAM (random access memory) chips. These integrated circuit chips have a pin grid array (PGA) package and are typically installed into a socket which is soldered to a computer circuit board. These integrated circuit devices, particularly the CPU microprocessor chips, generate a great deal of heat during operation which must be removed to prevent adverse effects on operation of the system into which the device is installed. For example, a PENTIUM microprocessor, containing millions of transistors, is highly susceptible to overheating which could damage or destroy the microprocessor device itself or other components proximal to the microprocessor.

In addition to the PENTIUM microprocessor discussed above, there are many other types of semiconductor device packages which are commonly used in computer equipment, for example. Recently, various types of surface mount packages, such as BGA (ball grid array) and LGA (land grid array) type semiconductor packages have become increasingly popular as the semiconductor package of choice for computers. For example, many microprocessors manufactured by the Motorola Corporation, for use in Apple Corporation computers, employ BGA-type packages. Unlike a PENTIUM microprocessor with a PGA package, which has pins to be installed into a receiving socket, BGA and LGA semiconductor packages include an array of electrical contacts on their bottom surfaces to engage directly with an array of receiving electrical contacts on a circuit board, socket or the like. These semiconductor device packages have, in the past, been soldered directly to a circuit board or socket. However, such direct soldering makes replacement and/or upgrade of the semiconductor device package more difficult because it must be unsoldered from the board or socket for such replacement or upgrade.

In similar fashion to the PENTIUM-type semiconductor devices discussed above, the BGA, LGA and related device packages also suffer from excessive generation of heat. If such heat is not properly dissipated, the chip will eventually fail. As a result, efforts have been made to supply a heat dissipating member, such as a heat sink, into thermal communication with the silicon portion of the semiconductor device package, such as a BGA or LGA chip. As a result of the competing needs for heat dissipation and pressure to maintain the socket connection, problems arise. In particular, simple clamping of a heat sink member to the top portion of a BGA socket must be maintained at a pressure sufficient to maintain the electrical interconnections to the socket; however, such a high pressure creates a risk of damage to the silicon portion of the package.

While the above configurations may be advantageous for optimal heat transfer, they typically suffer from poor vibration and shock resistance. For example, a very complex and delicate heat sink design may be ideal for optimized heat transfer but such a heat sink design typically results in poor resistance to vibration and shock. This is critically importance where heat generating objects, such as microprocessors, are commonly being incorporated into computers that are being shipped long distances to customers. This heightens the need for vibration and shock resistant heat sink assembly solutions.

In view of the foregoing, there is a demand for a heat sink assembly that can achieve high thermal conductivity. Further, there is a demand for a heat sink assembly that is vibration and shock resistant while achieving high thermal conductivity. Moreover, there is a demand for a heat sink assembly that can be easily installed and manufactured at low cost. In additional, there is a demand for a vibration and shock resistant heat sink assembly that can be easily removed when desired.

SUMMARY OF THE INVENTION

The present invention preserves the advantages of prior art heat sink assemblies for integrated circuit devices, such as microprocessors. In addition, it provides new advantages not found in currently available assemblies and overcomes many disadvantages of such currently available assemblies.

The invention is generally directed to the novel and unique heat sink assembly with particular application in cooling heat generating objects, such as microprocessor integrated circuit devices, including as a ball grid array (BGA) and land grid array (LGA) semiconductor device packages. The heat sink assembly of the present invention enables the simple, easy and inexpensive assembly, use and maintenance of a heat sink assembly while realizing superior heat dissipation. Also, the heat sink assembly of the present invention is vibration and shock resistant.

The vibration and shock resistant heat dissipating device of the present invention includes a retaining clip, having a central member and a pair of legs depending downwardly therefrom. An aperture is disposed through the central member and defines a central member bore having female threading formed therein. The free ends of the pair of legs are secured relative to the heat generating object. A heat dissipating member, having a threaded base portion with a substantially flat bottom surface, is adapted to be threadably received in the center member bore so that the flat bottom surface of the heat dissipating member is in flush thermal communication with the heat generating member. A ratchet member is disposed between the retaining clip and the heat dissipating member for controlling threaded receipt of the threaded base portion in the retaining clip. The ratchet member permits only inward installation threading of the base portion into the center member bore while preventing threaded removal of the base portion out from retaining clip. Use of a tool enables threaded removal of the base portion out from the retaining clip.

In operation, the retaining clip is mounted to an object to be cooled, such as a microprocessor or semiconductor package. The central member bore is positioned over the surface to be cooled. The threaded base of the heat dissipating member is threaded into the central member bore so that the flat bottom surface of the threaded base of the heat dissipating member contacts the surface to be cooled. During threaded installation, a wire pawl, emanating from the heat dissipating member, engages with a radial groove pattern on the top surface of the retaining clip. The wire pawl is positioned at an angle relative to the top surface of the retaining clip to permit threaded rotation of the threaded base in only the inward threaded installation direction. Unscrewing or unthreading the threaded base from the retaining clip will be virtually impossible. As a result, once the threaded base is threadably installed in the retaining clip, vibration and shock cannot cause unthreading or "backing out" of the heat sink member from the retaining clip which would, undesirably, result in inferior heat dissipation.

It is therefore an object of the present to provide a heat sink assembly that can accommodate a wide array of heat generating objects.

Another object of the present invention is to provide a heat sink assembly that is inexpensive and easy to install and manufacture.

It is a further object of the present invention to provide a heat sink assembly that is vibration and shock resistant.

It is a further object of the present invention to provide a heat sink assembly that prevent against unwanted disengagement of the heat sink assembly with the object to be cooled.

BRIEF DESCRIPTION OF THE DRAWINGS

The novel features which are characteristic of the present invention are set forth in the appended claims. However, the inventions preferred embodiments, together with further objects and attendant advantages, will be best understood by reference to the following detailed description taken in connection with the accompanying drawings in which:

FIG. 6 is a perspective view of a removal tool in accordance with the present invention; and FIG. 7 is a close-up side elevational view of the use of the removal tool shown in FIG. 6.

DETAILED DESCRIPTION OF THE PREFERRED EMBODIMENT

Figure 1:
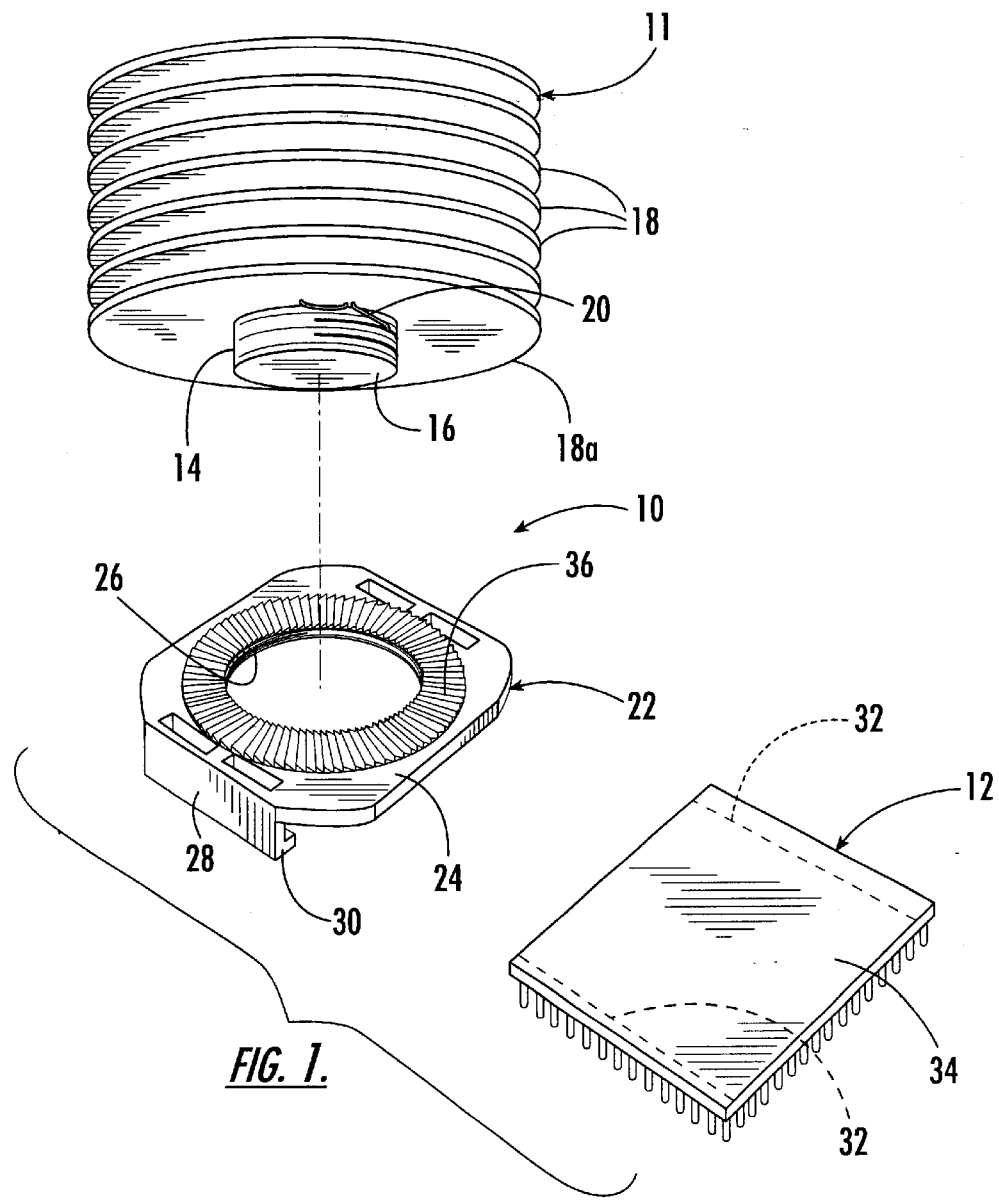
FIG. 1 is a exploded perspective view of the heat sink assembly of the present invention installed on a heat generating object.

Referring first to FIG. 1, a perspective view of the heat sink assembly 10 of the present invention is shown being installed on a heat generating object 12, such as a semiconductor device package. It should be understood that the present invention may be employed as a cooling solution for any type of heat generating surface or object. By way of example and for ease of illustration and discussion, the heat sink assembly 10 of the present invention is shown as providing a vibration and shock resistant solution for a semiconductor device package 12.

Figure 2:
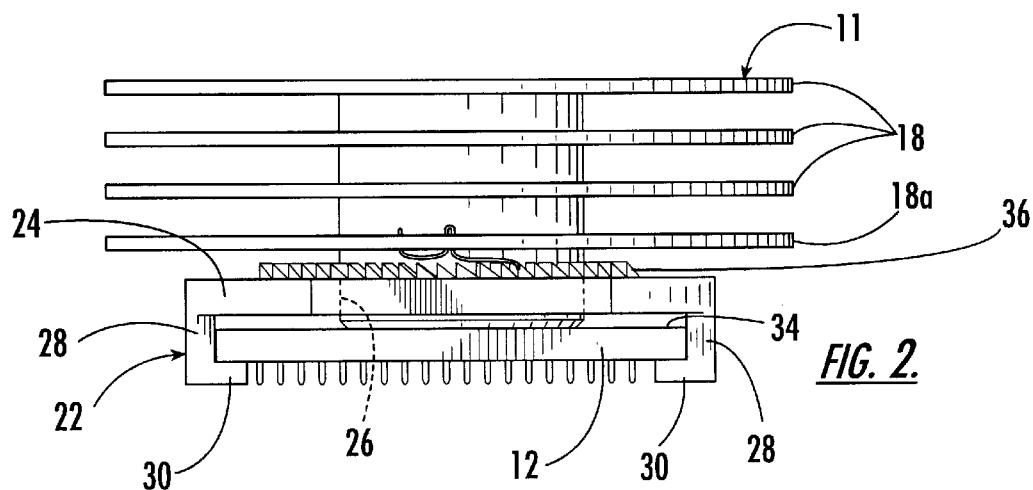
FIG. 2 is a side elevational view of the heat sink assembly shown in FIG. 1 fully installed on a heat generating object.

As shown in FIGS. 1 and 2, the heat sink assembly 10 is installed onto a semiconductor device 12, such as a Pentium III package or RAM package. A heat sink member 11 includes a male threaded base portion 14 with a lower flat surface 16 and heat dissipating fin members 18. A wire pawl 20, employed as a ratchet member, is connected to the bottom fin 18a of heat sink member 11 and is positioned to emanate in a downward, angled direction. A retaining clip 22 is provided with a central member 24. A bore 26 is provided within the central member 24 with female threading therein.

The retaining clip 22 includes a pair of downwardly depending legs 28 with associated inwardly facing free ends 30 to embrace the marginal edges 32 of the semiconductor device package 12.

These downwardly depending legs 28 with inwardly facing free ends 30 are a preferred configuration for securing the retaining clip 22 relative to the semiconductor device 12. However, it should be understood that many other structures may be employed for this purpose. For example, the downwardly depending legs 28 may include small windows or apertures (not shown) to engage with protrusions (not shown) emanating outwardly from the sides of a socket (not shown) in which the semiconductor device 12 is installed. Alternatively, the downwardly depending legs 28 may be simply bolted directly to a socket (not shown) or to a circuit board (not shown) onto which the semiconductor device 12 is installed. In general, and in accordance with the present invention, the retaining clip 22 is secured and fixed relative to the semiconductor package 12. The particular connection methods discussed above and other configurations employed depend on the particular application and installation environment at hand. For ease of discussion, the present invention will be discussed below as to the employment of downwardly depending legs 28 and inwardly facing and flanged free ends 30 which engage with the marginal portions 32 of the semiconductor device package 12.

As can best be seen in FIG. 2, the male threaded base 14 of the heat sink member 11 is threaded into the female threaded central member bore 26 so that the flat bottom surface 16 of the base portion 14 contacts the top surface 34 of the semiconductor package 12 to be cooled. Tightening of the threading of the base portion 14 within the retaining clip 22 causes the inwardly turned free end flanges 30 of the retaining clip 22 to grip on the bottom marginal portions 32 of the semiconductor device 12 to clamp and secure the entire assembly 10, 12 in place.

As stated above, there is a concern of vibration and shock resistance for heat sink assemblies 10. In connection with the general configuration shown in FIG. 1, there is a concern that the threaded base portion 14 may back out of the retaining clip 22, either during travel or from use over time.

However, the present invention provides for specific vibration and shock resistance by the incorporation of a wire pawl ratchet member 20 and corresponding grooves or notches 36 on the retaining clip 22. As seen in FIG. 1, the ratchet member is preferably a wire pawl connected to the bottom fin 18a of the heat sink member 11 while the grooving 36 is provided on the top surface 24 of the retaining clip 22. As will be described in detail below, the engagement of the wire pawl 20 and the grooves 36 on the retaining clip 22 provide the vibration and shock resistance in accordance with the present invention.

Figures 3, 4:
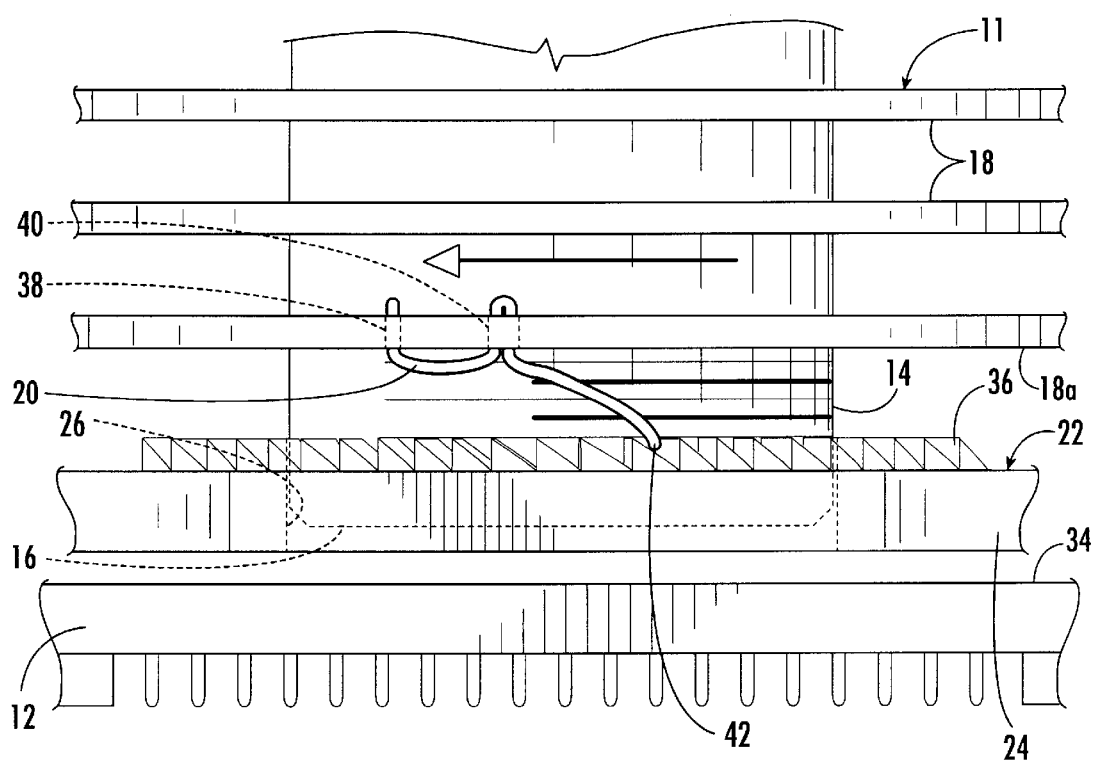
FIG. 3 is a close-up side elevational view of the heat sink assembly of FIG. 1 in the early process of being installed.
FIG. 4 is a close-up side elevational view of the heat sink assembly fully installed as shown in FIG. 2.

Referring now to FIGS. 3 and 4, the installation of the heat sink member 11 into the retaining clip 22 and the engagement of the pawl 20 and grooves 36 are shown in detail. In FIG. 3, the heat sink member 11 is threaded into the retaining clip 22 by threaded engagement of the male threaded base portion 14 into the female threaded bore 26 of the retaining clip 22. The wire pawl 20 extends downwardly from the heat sink member 11, preferably from the lower-most radial fin 18a of the heat sink member 11. In other heat sink member configurations (not shown), the wire pawl 20 may be connected to any portion of the heat sink member 11 that is proximal to the grooves 363 of retaining clip 22. In the preferred configuration, where a radial finned heat sink 11 is used, the wire pawl 20 is appropriately connected to the bottom of the lowermost fin 18a of the heat sink member 11. Preferably, the wire pawl 20 is bent into the configuration as shown where one mount end resides in a first hole 38 in the fin 18a and then bent and inserted into a second hole 40 in the fin 18a. The free end 42 is the ratchet contact tip end of the wire pawl 20 that contacts the groove configuration 36. In this wire pawl configuration, no glue or stapling is required because the wire pawl is connected by a friction press fit. The dual connection to the last fin 18a in two holes 38 and 40 prevents unwanted twisting of the wire pawl 20 during ratcheting. The wire pawl 20 is preferably made of metal but can be other materials, such as plastic or may be machined directly into the heat sink member 11. It should be understood that many other ratchet devices may be employed instead of the preferred wire pawl configuration. For example, a band of material, of either plastic or metal, may be employed.

In FIG. 3, the initial threading of base portion 14 of the heat sink member 11 into the retaining clip 22 causes the free end 42 of the wire pawl 20 to ride along the groove pattern 36 on the top surface 24 of the retaining clip 22. As the heat sink member 11 is rotated, the wire pawl 20 clicks to a further groove 36. FIG. 4 shows further rotation of the heat sink member 11 whereby the wire pawl 20 is almost horizontal relative to the plane of the grooves 36. The bottom 16 of the heat sink member 11 is in flush thermal communication with the top surface 34 of the object 12 to be cooled. Since the wire pawl 20 is disposed at an angle relative to the plate of the grooves 36 and the free end 42 of the wire pawl 20 is slightly bent downwardly, unthreading or reverse rotation of heat sink member 11 is virtually impossible.

Figure 5:
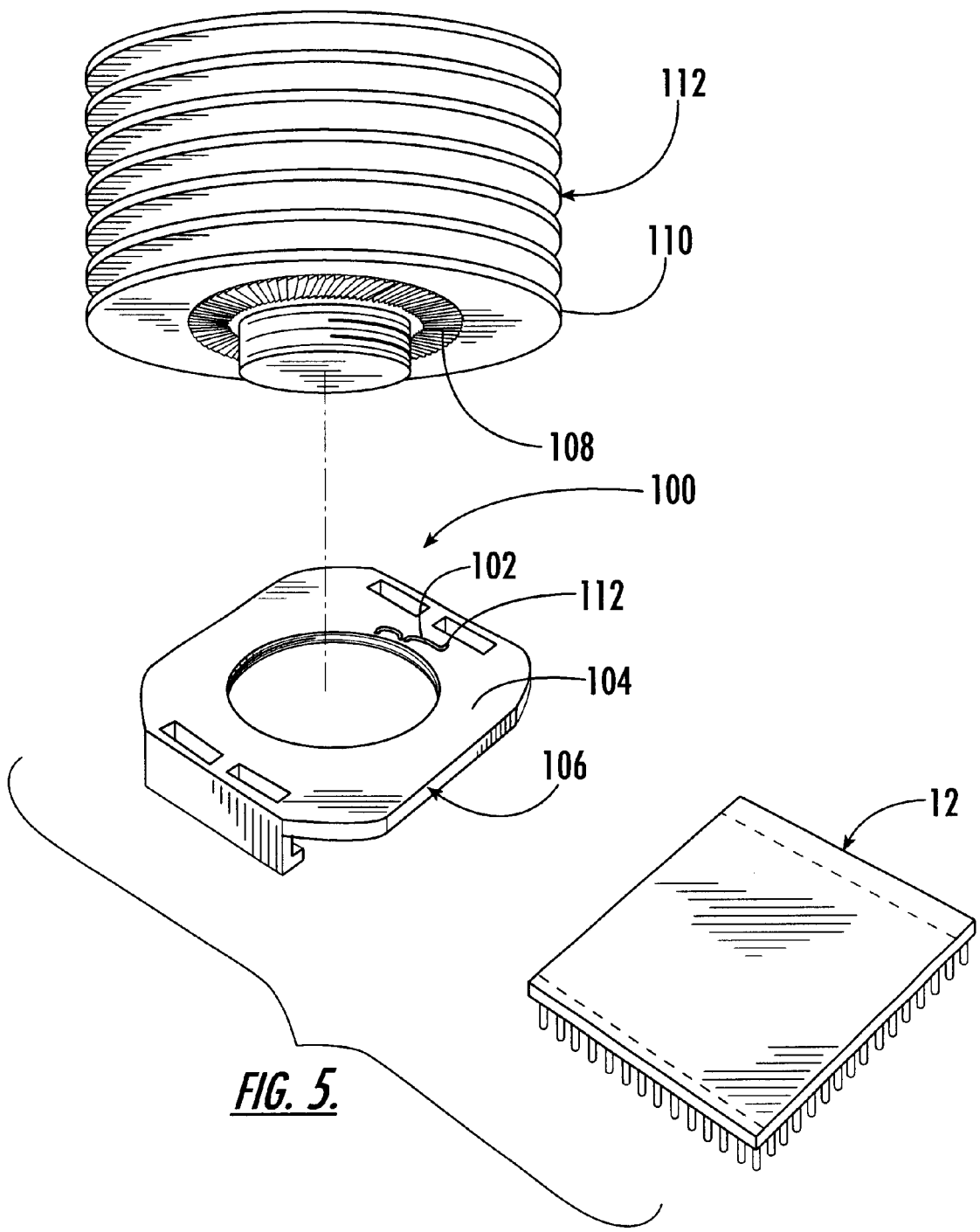
FIG. 5 is an exploded perspective view of an alternative embodiment of the heat sink assembly in accordance with the present invention.

Referring now to FIG. 5, an alternative embodiment 100 of the present invention is shown. In this embodiment, the wire pawl 102 is provided on the top surface 104 of the retaining clip 106, which receives the heat generating object 12, while the ratchet groove pattern 108 is provided on the bottom surface of the bottom most fin 110 of the heat sink member 112. A mount end of the wire pawl 102 is mounted in a first hole while the bent portion is mounted in a second hole to provide a free ratchet end with a slightly bent tip end 112. As can be understood, threading of the male threaded heat sink member 112 causes the grooving 108 to engage with the wire pawl 112 to prevent reverse rotation or unthreading of the heat sink member 112 from the retaining clip 106. Depending the application and the materials used, this configuration may be desirable.

The ratcheting system of the present invention is incorporated directly into the heat sink assembly 10, 100 to provide vibration and shock resistance. The wire pawl 20, 102 and groove configuration 36, 108 prevent reverse rotation or unthreading of the heat sink member 11, 112 from the retaining clip 22, 106. However, there may be instances where reverse rotation or unthreading of the heat sink member 11, 112 from the retaining clip 22, 106 is desired. For example, removal or replacement of the heat sink member 11, 112 and retaining clip 22, 106 may be required. As a result, there may be a need for disengaging the wire pawl 20, 102 from the grooving 36, 108 to permit free rotation of the heat sink member 11, 112 relative to the retaining clip 22, 106 to thereby permit reverse rotation of the heat sink member 11, 112. FIG. 6 illustrates a removal tool 200, in accordance with the present invention, that can be used both with the preferred embodiment 10 and the alternative embodiment 100 of the present invention. The removal tool 200 is a substantially planar member with a shank-receiving cut out 202. The removal tool 200 is inserted between the bottom fin 18a, 110 of the heat sink member 11, 112 and the top surface of the retaining clip 22, 106, as seen in FIG. 7. The removal tool 200 causes the wire pawl 20, 102 to lift off of the grooves 36, 108 to disengage the ratchet system. As a result, the heat sink member 11, 112 can be freely unthreaded from the retaining clip 22, 106 for easy removal. Once the heat sink assembly 11, 112 is removed, the retaining clip 22, 106 can be easily removed from the heat generating object 12.

It is preferred that the retaining clip 22, 106 be manufactured of a plastic material, such as a high temperature resistant and high creep resistant plastic for better withstanding the high temperatures associated with heat generating objects, such as microprocessors. For example, the plastic material for the retaining clip may be LNP VERTON UF-700-10-HS (P.P.A. 50% long fiber) for use in high temperate heat sink applications. Alternatively, the retaining clip 22, 106 may be manufactured of metal, such as aluminum, depending on the application. In addition, the heat sink member 11, 112 is preferably metal, such as aluminum, for optimum thermal transfer and dissipation of heat from the heat generating object 12. Alternatively, the heat sink member 11, 112 may be made of a thermally conductive plastic depending on the application. The heat sink member 11, 112 preferably includes a radial fin configuration but various other heat sink fin configurations, such as a pin grid array, may be employed.

It should be understood that all of the threaded components of the present invention may include various types of threads which are envisioned and are deemed to be within the scope of the present invention. These various thread designs include continuous and interrupted threads. It is preferred that there be at least more than one turn to facilitate the adjustment of pressure. However, a single turn 360° thread, as well as half and quarter turn thread are considered to be within the scope of the present invention due to the ability to impart any desired pressure. Further, bayonet-type attachment methods, which engage with ramped notches within a bore, are also considered to be threads which can provide a gradual, hand-controllable pressure in accordance with the present invention.

It would be appreciated by those skilled in the art that various changes and modifications can be made to the illustrated embodiments without departing from the spirit of the present invention. All such modifications and changes are intended to be covered by the appended claims.

What is claimed is:

1. A vibration and shock resistant heat dissipating device for removing heat from a heat generating object, comprising:

a retaining clip, having a central member and a pair of legs depending downwardly from respective opposing ends of said central member with ends of said pair of legs not connected to said central member being free ends, an aperture disposed through said central member defining a central member bore; female threading formed in said central member bore; means for securing said free ends of said pair of legs relative to said heat generating object; said central member bore being positioned substantially above said heat generating object;

a heat dissipating member having a threaded base portion with a substantially flat bottom surface adapted to be threadably received in said center member bore so that said flat bottom surface of said heat dissipating member is in flush thermal communication with said heat generating member; and ratchet means disposed between said retaining clip and said heat dissipating member for controlling threaded receipt of said threaded base portion in said center member bore of said retaining clip; said ratchet means permitting only threading of said base portion into said center member bore while preventing threaded removal of said base portion out from said center member bore.

2. The heat dissipating device of claim 1, wherein said ratchet means is a length of wire pawl connected to and emanating from said heat dissipating member in communication with a radial grooved pattern on said retaining clip.

3. The heat dissipating device of claim 1, wherein said ratchet means is a length of wire pawl connected to and emanating from said retaining clip in communication with a radial grooved pattern on heat dissipating member.

4. The heat dissipating device of claim 1, wherein said retaining clip is made of plastic.

5. The heat dissipating device of claim 1, wherein said retaining clip is made of metal.

6. The heat dissipating device of claim 1, wherein said retaining clip is made of thermally conductive plastic.

7. The heat dissipating device of claim 1, wherein said heat dissipating member is made of metal.

8. The heat dissipating device of claim 1, wherein said heat dissipating member is made of thermally conductive plastic.

9. A vibration and shock resistant heat dissipating device for removing heat from a heat generating object, comprising:

a retaining clip, having a central member with a top surface and a pair of legs depending downwardly from respective opposing ends of said central member with ends of said pair of legs not connected to said central member being free ends, an aperture disposed through said central member defining a central member bore; female threading formed in said central member bore; means for securing said free ends of said pair of legs relative to said heat generating object; said central member bore being positioned substantially above said heat generating object; said retaining clip defining a plurality of radial grooves disposed in the top surface of the central member of said retaining clip in a region circumferentially about said central member bore;

a heat dissipating member having a threaded base portion and a plurality of heat dissipating fins including a lower fin with a bottom surface; said threaded base portion including a substantially flat bottom surface adapted to be threadably received in said center member bore so that said flat bottom surface of said heat dissipating member is in flush thermal communication with said heat generating member; and a resilient ratchet member, having a free end, connected to said bottom surface of said lower fin of said heat dissipating member and being spring-biased toward said plurality of radial grooves; said free end of said resilient ratchet member being engagable with said radial grooves upon threading of said threaded base portion of said heat dissipating member into said center member bore.

10. The heat dissipating device of claim 9, wherein said free end of said resilient ratchet member is angled against the direction of rotation of said heat dissipating member for installing said heat dissipating member into said center member bore.

11. The heat dissipating device of claim 9, wherein said retaining clip is made of plastic.

12. The heat dissipating device of claim 9, wherein said retaining clip is made of metal.

13. The heat dissipating device of claim 9, wherein said retaining clip is made of thermally conductive plastic.

14. The heat dissipating device of claim 9, wherein said heat dissipating member is made of metal.

15. The heat dissipating device of claim 9, wherein said heat dissipating member is made of thermally conductive plastic.

16. A vibration and shock resistant heat dissipating device for removing heat from a heat generating object, comprising:

a retaining clip, having a central member with a top surface and a pair of legs depending downwardly from respective opposing ends of said central member with ends of said pair of legs not connected to said central member being free ends, an aperture disposed through said central member defining a central member bore; female threading formed in said central member bore; means for securing said free ends of said pair of legs relative to said heat generating object; said central member bore being positioned substantially above said heat generating object; said retaining clip defining a plurality of radial grooves disposed in the top surface of the central member of said retaining clip in a region circumferentially about said central member bore;

a heat dissipating member having a threaded base portion and a plurality of heat dissipating fins including a lower fin with a bottom surface; said threaded base portion including a substantially flat bottom surface adapted to be threadably received in said center member bore so that said flat bottom surface of said heat dissipating member is in flush thermal communication with said heat generating member; said retaining clip defining a plurality of radial grooves disposed on the bottom surface of the lower fin of said heat dissipating member in a region circumferentially about said threaded base portion; and a resilient ratchet member, having a free end, connected to said top surface of said retaining clip and being spring-biased toward said plurality of radial grooves; said free end of said resilient ratchet member being engagable with said radial grooves upon threading of said threaded base portion of said heat dissipating member into said center member bore.

17. The heat dissipating device of claim 16, wherein said free end of said resilient ratchet member is angled toward the direction of rotation of said heat dissipating member for installing said heat dissipating member into said center member bore.

18. The heat dissipating device of claim 16, wherein said retaining clip is made of plastic.

19. The heat dissipating device of claim 16, wherein said retaining clip is made of metal.

20. The heat dissipating device of claim 16, wherein said retaining clip is made of thermally conductive plastic.

21. The heat dissipating device of claim 16, wherein said heat dissipating member is made of metal.

22. The heat dissipating device of claim 16, wherein said heat dissipating member is made of thermally conductive plastic.

* * * * *